(12) United States Patent
Duerk et al.

(10) Patent No.: US 7,835,780 B1
(45) Date of Patent: Nov. 16, 2010

(54) MR INVASIVE DEVICE AND METHOD FOR ACTIVE MR GUIDANCE OF INVASIVE DEVICES WITH TARGET NAVIGATION

(76) Inventors: Jeffrey L. Duerk, 519 Rockwood Ct., Avon Lake, OH (US) 44012; Qiang Zhang, 6100 Laurent Dr., Parma, OH (US) 44129; Michael Wendt, 51 Valley Stream Pkwy., Malvern, PA (US) 19355; Yiu-Cho Chung, 448 E. Ontario Suite 700, Chicago, IL (US) 60611; Jonathan S. Lewin, 24604 Letchworth Rd., Beachwood, OH (US) 44122; Elmar M. Merkle, Strassburgerweg 8, 89077, Ulm (DE)

( * ) Notice: Subject to any disclaimer, the term of this patent is extended or adjusted under 35 U.S.C. 154(b) by 0 days.

(21) Appl. No.: 10/240,219

(22) PCT Filed: Mar. 30, 2001

(86) PCT No.: PCT/US01/10041

§ 371 (c)(1),
(2), (4) Date: May 30, 2003

(87) PCT Pub. No.: WO01/75465

PCT Pub. Date: Oct. 11, 2001

Related U.S. Application Data

(60) Provisional application No. 60/193,294, filed on Mar. 30, 2000.

(51) Int. Cl.
*A61B 5/05* (2006.01)
(52) U.S. Cl. .................. 600/410; 600/411; 600/417; 600/420; 600/421; 600/422

(58) Field of Classification Search ................ 606/130; 600/434, 429, 410, 411, 417, 420–424
See application file for complete search history.

(56) References Cited

U.S. PATENT DOCUMENTS

| | | | | |
|---|---|---|---|---|
| 4,572,198 | A * | 2/1986 | Codrington | 600/410 |
| 5,243,289 | A * | 9/1993 | Blum et al. | 324/322 |
| 5,638,819 | A * | 6/1997 | Manwaring et al. | 600/424 |
| 5,876,338 | A * | 3/1999 | Gilderdale et al. | 600/411 |
| 5,964,705 | A * | 10/1999 | Truwit et al. | 600/423 |
| 6,016,439 | A * | 1/2000 | Acker | 600/411 |
| 6,083,163 | A * | 7/2000 | Wegner et al. | 600/429 |
| 6,272,370 | B1 * | 8/2001 | Gillies et al. | 600/411 |
| 6,317,091 | B1 * | 11/2001 | Oppelt | 343/742 |
| 6,470,204 | B1 * | 10/2002 | Uzgiris et al. | 600/411 |
| 6,593,884 | B1 * | 7/2003 | Gilboa et al. | 342/448 |

* cited by examiner

*Primary Examiner*—Brian Casler
*Assistant Examiner*—James Kish

(57) ABSTRACT

An invasive device having an inductive coupling element. One embodiment of the invasive device includes a plurality of receive coils inductively coupled to a communicating coil. The receive coils are selectively tuned and detuned to receive MR signals for providing coordinate information used for device tracking. A second embodiment of the invasive device includes a receive coil having a plurality of winding elements separated from each other by different distances. A method of rapidly acquiring both the invasive device orientation and position information to dynamically adapt MR scan planes to continuously follow the invasive device relative to a target is provided. The target-navigation technique automatically defines the MR scan plane and a time domain multiplexing technique is applied for MR imaging and device tracking. Using these techniques, the acquired MR images shows both the invasive device and the target tissue.

24 Claims, 12 Drawing Sheets

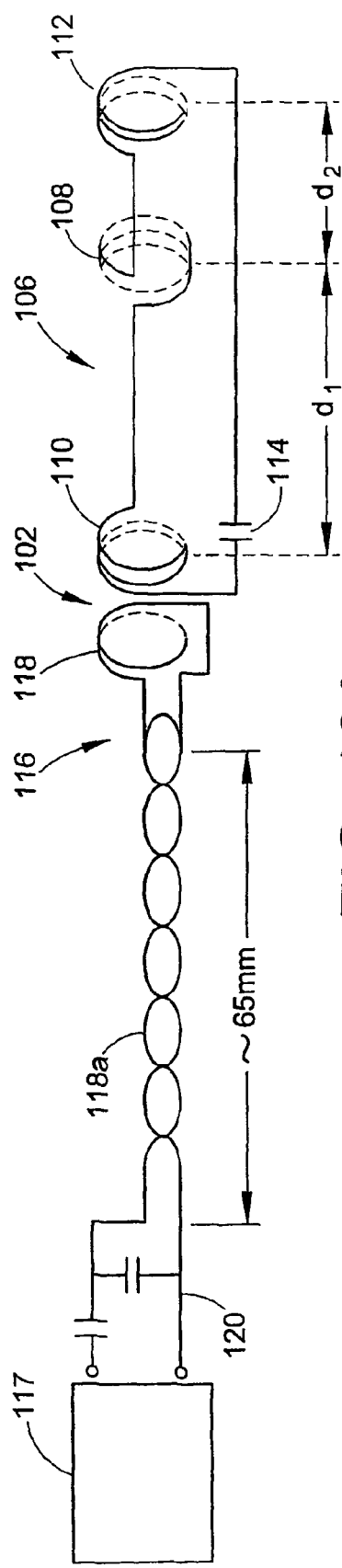
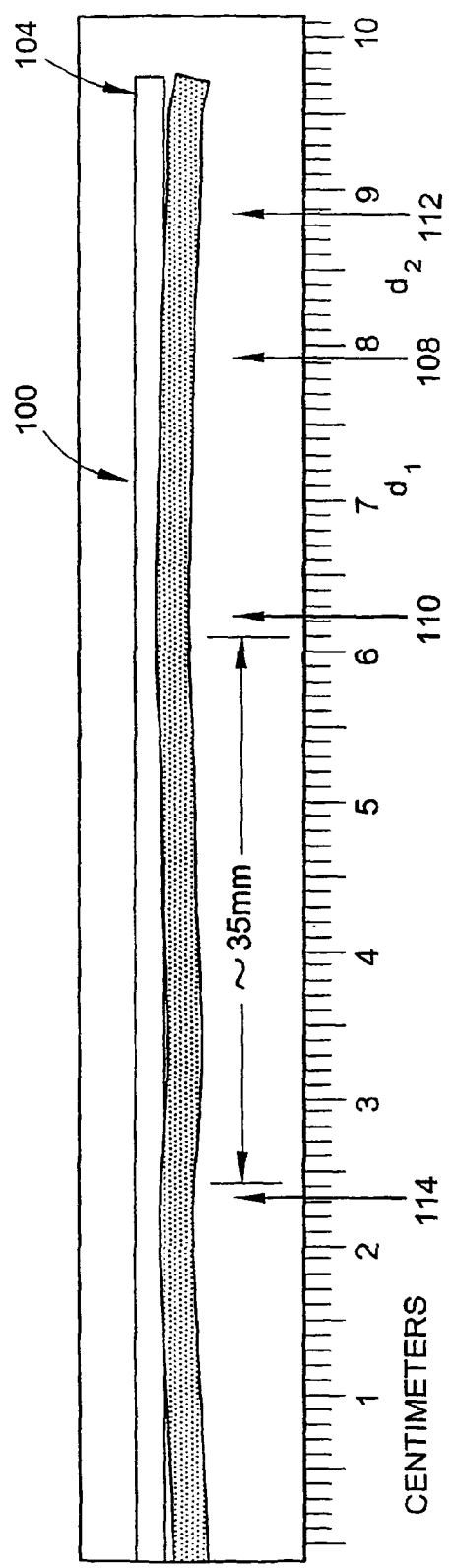

MR INVASIVE DEVICE AND METHOD FOR ACTIVE MR GUIDANCE OF INVASIVE DEVICES WITH TARGET NAVIGATION

CROSS REFERENCE TO RELATED APPLICATIONS

This application claims the benefit of U.S. Provisional Application No. 60/193,294, filed Mar. 30, 2000, which is hereby incorporated herein by reference.

BACKGROUND OF THE INVENTION

The present invention relates to magnetic resonance (MR) imaging. More particularly it relates to an improved invasive device capable of providing position and orientation information in an MR system. The invention further relates to a method of rapidly acquiring information on both the position and orientation of an invasive device to dynamically define MR scan planes for continuous tracking of the invasive device. The invasive device tracking information and dynamic MR imaging are used to show both the invasive device and the target to enhance target-navigation.

In invasive MR guided procedures, reliable and accurate visualization of surgical and interventional instruments hereinafter referred to as invasive devices, inside the body of the subject is essential for procedure success. Micro radio frequency (RF) coils have been used for MR tracking of invasive devices. In typical applications, one small RF coil integrated into the tip of an invasive device detects RF signals from the immediate surroundings and the tip position is calculated from the detected MRI signals.

During previous device tracking procedures, graphical markers representing the device tip are overlain on pre-acquired, static roadmap images of the subject. Roadmap images are acceptable for invasive procedures performed on subjects having little motion. However the static roadmap may contribute to misregistration error due to subject movement that is likely to occur, for example, in abdominal invasive procedures. Moreover, when the invasive device trajectory is complex, such as in intravascular procedures, it is quite possible for the device to deviate from the roadmap scan plane. Accordingly the simple overlay of a graphical marker on a static roadmap image can lead to an incorrect representation of the true position of the device.

Device orientation and tip position together provide device trajectory information sufficient for accurate MRI guided interventional procedures. However significant challenges exist in acquiring the trajectory information. Multiple coils disposed on the device have been used in attempt to provide the locations of several points on the invasive device for determining the device's trajectory. However such approaches have not solved the problems inherent with standing wave generation from multiple leads connected to the coils.

Other attempts have used a single coil with multiple windings to provide the location information of several points on the invasive device. However such attempts have not provided the necessary unique correspondence between the winding elements and the 1DFT peaks since the signals from each winding element are induced simultaneously. For example, if a single coil has two winding elements, two peaks ($x_1$ and $x_2$, or $y_1$ and $y_2$, or $z_1$ and $z_2$) will be detected from a gradient echo along any one of three orthogonal axes (x, y, or z axis). There are two possible ways to assign these two peaks to the spatial coordinates of the two winding elements, e.g. ($x_1$, $x_2$) or ($x_2$, $x_1$). In total, there will be 2*2*2=8 possible combinations of ($x_1$, $y_1$, $z_1$) and ($x_2$, $y_2$, $z_2$) which can be assigned to the coordinates of the coils only two of which are the true coil locations.

A second problem, known as peak ambiguity, exists with using multiple windings. When the field gradient is applied almost orthogonal to the axis of the single multi-element micro coil, each coil element may lie at approximately the same coordinate along the gradient axis and hence induce signals at similar frequencies. The multiple peaks in the 1DFT may not fall beyond the spectral resolution of the acquisition so that the normally separate peaks merge into only one. Thus valuable information on one of the coordinates may not be available to the precision needed for guidance.

Accordingly, it has been considered desirable to develop a new and improved invasive device and method of guiding an invasive device using target navigation.

SUMMARY OF THE INVENTION

The invention includes a method of rapidly acquiring both the invasive device orientation and position information to dynamically adapt MR scan planes to continuously follow the invasive device. The invention further includes a new target-navigation concept for invasive device placement. The target-navigation technique automatically defines the MR scan plane and a time domain multiplexing technique is applied for MR imaging and device tracking. Using these techniques, the acquired MR images always show both the invasive device and its target tissue.

The invention also includes an invasive device having an inductive coupling element. One embodiment of the invasive device includes a plurality of receive coils inductively coupled to a communicating coil. The receive coils are selectively tuned and detuned to receive MR signals for providing coordinate information used for device tracking. A second embodiment of the invasive device includes a receive coil having a plurality of winding elements separated from each other by different distances.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 10A is an electrical schematic illustrating a second embodiment of the device in accordance with the invention and 10B is a photo of the device illustrated in FIG. 10A;

DETAILED DESCRIPTION OF THE INVENTION

Figure 1:
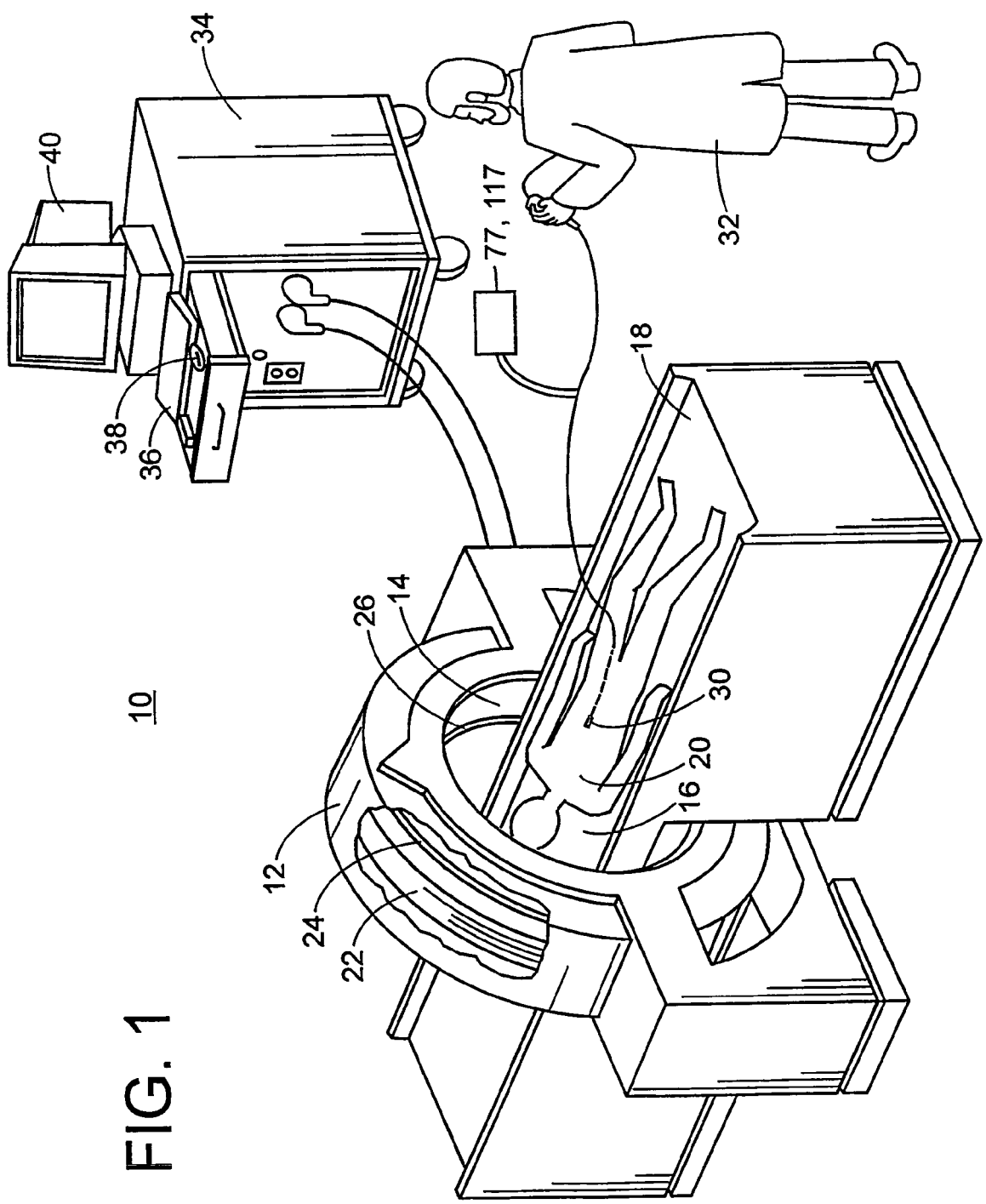
FIG. 1 is a perspective view of an embodiment of the invention.

With reference to FIG. 1, an MRI system is shown generally at 10 and includes a housing 12 forming a bore 14, which substantially surrounds a region of interest 16 including a support table 18 on which a subject 20 is positioned. A magnet 22 and a set of magnetic field gradient coils 24, which substantially surround the support table 18 and the subject 20, are included in the housing 12. The gradient coils 24 create magnetic field gradients having predetermined strengths, in three mutually orthogonal directions, at predetermined times. A plurality of external coils 26 (only one is shown in FIG. 1) also surround the region of interest 16. The external coils 26 radiate RF energy into the region of interest 16 and the subject 20 at predetermined times and with sufficient power at a predetermined frequency so as to create nuclear magnetic spins within the subject 20 in a fashion well known to those skilled in the art. The spins resonate at the Larmor frequency (approximately 8.25 MHz at 0.2 T and 64 MHz at 1.5 T), which is directly proportional to the strength of the magnetic field experienced by the spin. This field strength is the sum of the static magnetic field generated by the magnet 22 and the local field generated by the magnetic field gradient coil 24.

FIG. 1 shows one embodiment of an external coil 26 which has a diameter sufficient to encompass the entire subject 20. Other geometries such as smaller external coils (e.g., surface coils) specifically designed for imaging the head or an extremity are also contemplated. The MR system 10 described above is for illustrative purposes only. The invention is suitable for use in any known MR system including an open MR system. The MR imaging system used for conducting experimental trials was a 0.2 T, Open MR imager (Siemens Medial Systems, Erlangen, Germany). The Open MR scanner included a single receiver channel active during RF reception.

An invasive device 30 is inserted by an operator 32 into a portion of the subject 20 located within the bore 14 (i.e., within a bore of the magnet 22). The device 30 contains at least one (1) RF coil which detects MR signals generated in the subject 20 responsive to the RF field created by the external coils 26.

Figure 2:
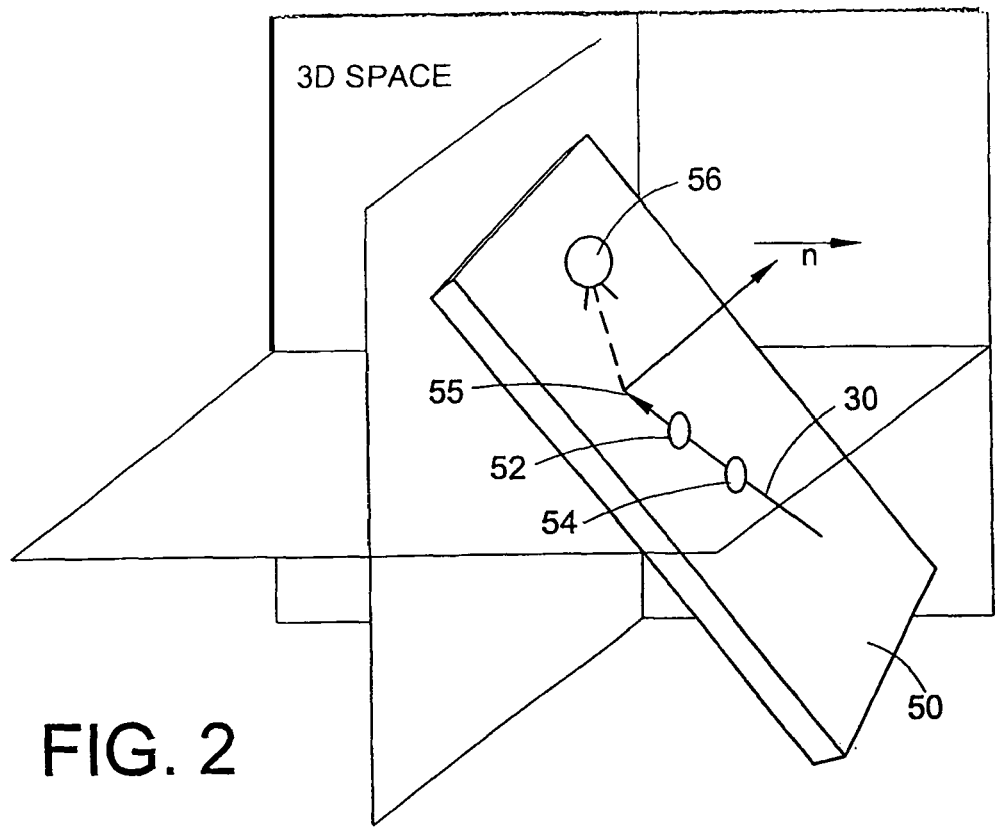
FIG. 2 illustrates a scan plane in accordance with the invention.

Referring now to FIG. 2, an MR scan plane determined in accordance with the invention is shown generally at 50. The scan plan 50 is defined by three points including two points 52, 54 on the invasive device 30, preferably disposed near the device tip 55, and a third point 56 representing the target position. In this embodiment, the device 30 lies within the scan plane 50. The two points 52, 54 on the device 30 provide device orientation and tip information, which together provide device trajectory information that enables accurate device tracking as described below. The target position 56 is determined using typical MR morphology scanning in a manner as described below.

Figure 3:
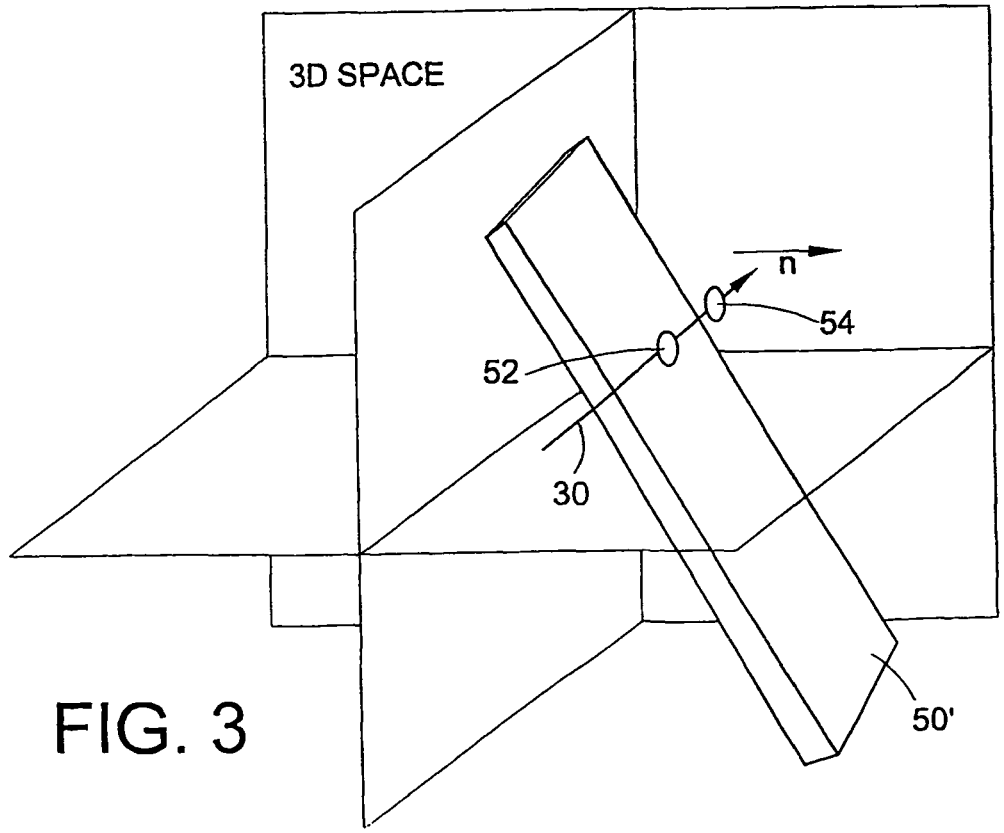
FIG. 3 illustrates a second embodiment of the scan plane in accordance with the invention.

A second embodiment of the scan plane is shown generally at 50' in FIG. 3. The points 52, 54 on the device 30 are used to determine the orientation of the device. A plane can be defined by a point in the plane and a normal to the plane. The device 30, the orientation of which is determined by points 52, 54, is used as the normal, and the scan plane 50' is defined by the orientation of the device 30 and one point 52 on the device. In this embodiment, the scan plane 50' is perpendicular to the device 30.

Figure 4:
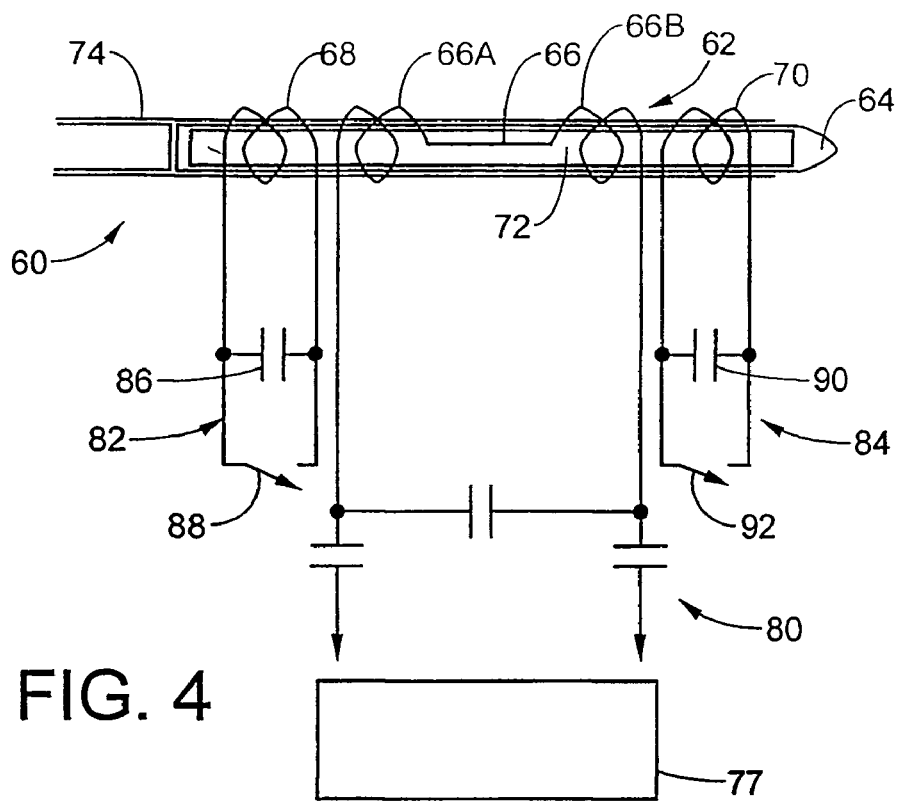
FIG. 4 is a sectional schematic view of an invasive device in accordance with the invention.

Referring now to FIG. 4, a first embodiment of the invasive device 30, is a catheter shown generally at 60. Although a catheter 60 is discussed for the purposes of illustrating the invention, it should be appreciated that the invasive device 30 can also be a guide wire, an endoscope, a laparoscope, a biopsy needle, a surgical instrument or any other suitable known invasive device for use in an MR environment.

A 5F catheter was selected for use, although any suitably sized catheter may be used. The catheter 60 includes an inductive coupling structure 62, preferably disposed near the tip 64 at a distance from about 1 to 10 mm, although greater distances may be used. The inductive coupling structure may itself form the tip of the catheter when it is attached thereto. The inductive coupling structure 62 includes a first RF micro coil 66, a second RF micro coil 68 and third RF micro coil 70. The three micro coils are disposed in a spaced apart, coaxial relationship along the catheter 60. The micro coils 66, 68, 70 are each wound with AWG 34 wire, although, any suitable gauge wire may be used. The second 68 and third 70 coils have 20 turns each, although any suitable number of turns may be used. All three coils 66, 68, 70 are wound around a tube 72 filled with Gd-DTPA doped saline which is known to enhance signal reception, although alternatively, saline may be used, or tissue surrounding the catheter. A layer of transparent shrink-tube 74 is used to bind the tube 72 and catheter 60. The distance between the second 68 and third 70 coils is approximately 20 mm, although any suitable distance may be used. At least one of the coils 68, 70 is preferably disposed at a distance from about 1 to 10 mm from the tip 64, although with larger catheters, greater distances may be used.

The first coil 66, also referred to as the communicating coil, is disposed between the second 68 and third 70 coils to inductively couple RF signals from second 68 and third 70 coils to a single receiver channel 77 of an MR scanner, over conductive leads 78. An impedance matching network 80 is electrically connected to the leads 78, and the first coil 66 is tuned to a frequency higher than the Larmor frequency. A large portion of the inductance of first coil 66 comes from its conductive leads 78.

The first coil 66 includes a first winding 66A disposed adjacent the second coil 68. The first winding 66A has two turns, although any suitable number may be used, which are wound in the same direction as the windings of the second coil 68 to inductively couple RF signals from the second coil 68 to the first coil 66. The first coil 66 also includes a second winding 66B disposed adjacent the third coil 70. The second winding 66B also has two turns, although any suitable number may be used, which are wound in the same direction as the windings of the third coil 70 to inductively couple RF signals from the third coil 70 to the first coil 66. The first 66A and second 66B windings are wound in opposite directions with respect to each other, such that the first coil 66 forms an opposed solenoid.

The second 68 and third 70 coils, receive coils, are individually tuned to and detuned from the Larmor frequency in an alternating manner using separate tuning circuits 82 and 84 respectively. Preferably, both of the coils 68 and 70 will not be tuned to the Larmor frequency for receiving MR signal information at the same time. Tuning circuit 82 includes one or more tuning capacitors 86 and a switch 88 for selectively tuning or detuning the second coil 68 in dependence upon the switch position and location within the circuit. For example the switch 88 may be placed in parallel with the one or more tuning capacitors 86 and the tuning circuit will be tuned to the Larmor frequency when the switch is open and detuned when the switch is closed.

Alternatively, the switch may be placed in series with the one or more tuning capacitors and the circuit will be tuned when the switch is closed and detuned when the switch is opened. Tuning circuit 84 also includes one or more tuning capacitors 90 and a switch 92 configured similarly to tuning circuit 82 for selectively tuning and detuning the circuit 84 in a similar manner. Alternatively, a double pole switch may be used in place of both switches 88, 92. The windings in the first and second coils may be loops, saddles, birdcages, butterflies or any other known MR coil geometries.

Figure 5A:
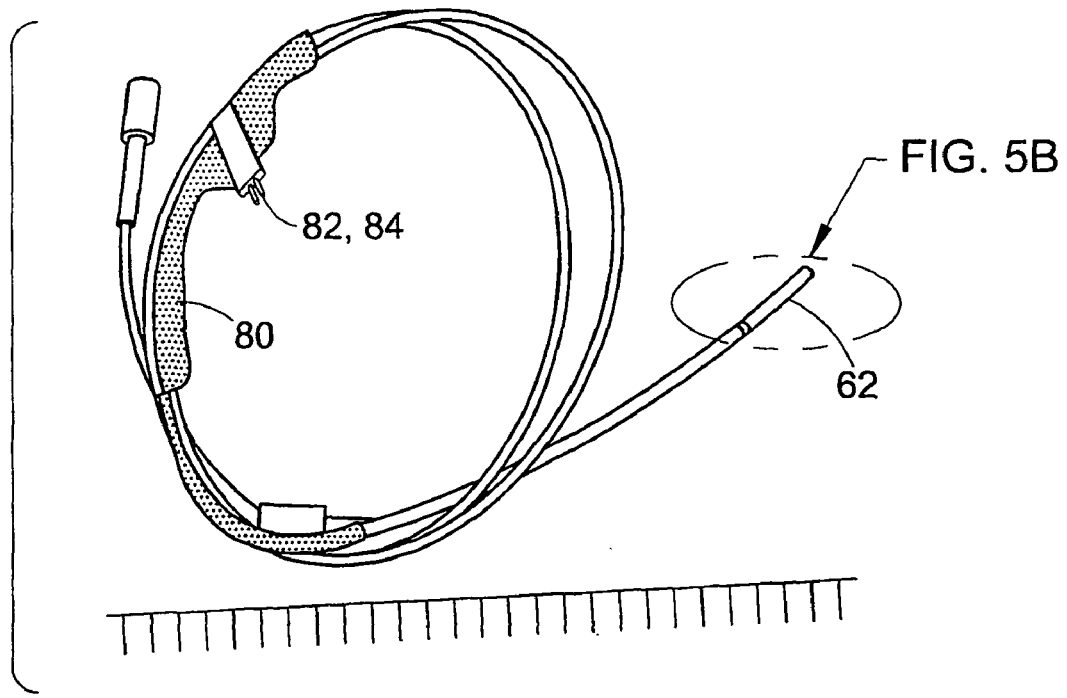
FIGS. 5A and 5B illustrate the invasive device shown in FIG. 4 in accordance with the invention.
Figure 5B:
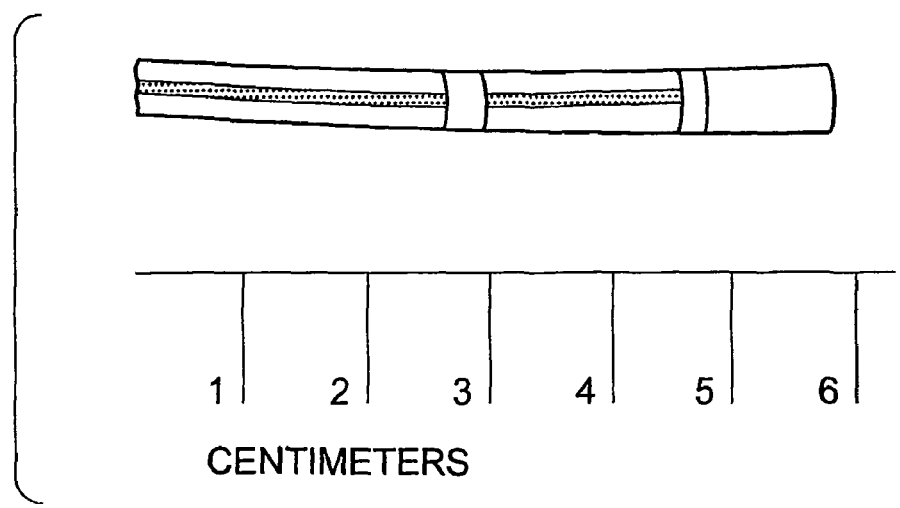

Referring now to FIGS. 5A and 5B photos of the catheter 60 are shown illustrating the inductive coupling structure 62. Detuning circuits 82 and 84 for the second 68 and third 70 coils are shown, as well as the impedance matching circuit 80 for the first coil.

Figure 6:
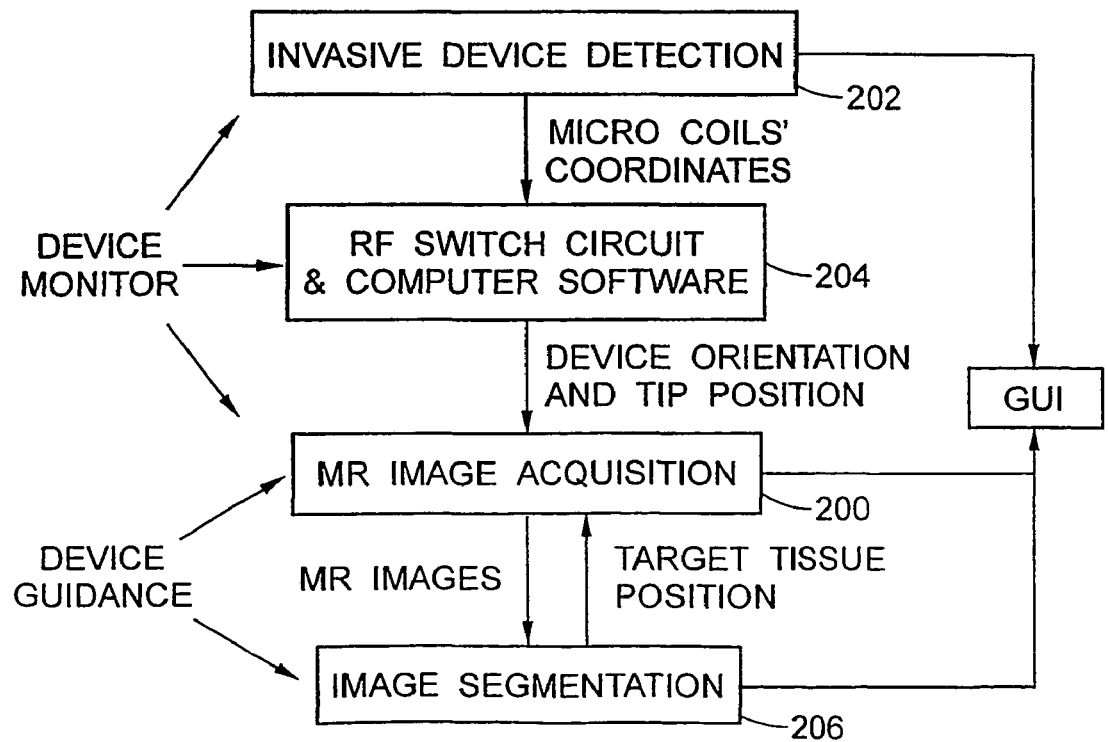
FIG. 6 is a block diagram illustrating the method of MR invasive device guidance with target navigation in accordance with the invention.

Referring now to FIG. 6 an active MR guidance system for invasive devices with target navigation is shown in block diagram form. An MR image is obtained at 200 to register a location of a target within a subject.

Next a trajectory of the invasive device is tracked within the subject by detecting at 202 the location of the receive coils 68, 70 in terms of the MR system coordinates in a manner described below. The device tip position is then calculated 204 in a known manner using the predetermined distances at which the coils are fixed on the device relative to the device tip which are known. The trajectory of the device is then determined using the coordinate information describing the location of the receive coils 68, 70 and the location of the device tip just calculated. Image segmentation is used to obtain the position of the target as described below.

Next, the scan plane is dynamically defined as a function of the target location and the device trajectory. The normal vector (the cross product of the vector defining the device trajectory and the vector from the tip location of the target tissue) and image center position are calculated and used in determining the scan plane location and orientation. Software is also provided to dynamically adjust/calibrate the MRI system according to the coil and sequence to be used. Data identifying a slice position and an orientation, which defines the scan plan in terms of MR system coordinates and a planar rotation, is provided to a processing unit to then acquire an MR image at the scan plane. The device trajectory is displayed together with an MR image of the target in a graphical 3D coordinate reference frame adjacent to the acquired MR images on a Graphic User Interface to provide a dynamic format for guiding the invasive device to the target. The differences between the ideal and real trajectories of the invasive device are also tabulated on the GUI.

The device detection step and the RF switching step work with the MR image acquisition step to monitor the invasive device location. An image segmentation step described below uses the most recently acquired MR images to determine the current position of the target. The current target position is fed back to the MR image acquisition step to define the next MR scan plane. The MR image acquisition step and image segmentation step provide necessary information for guiding the invasive device toward its target tissue, ensuring that the acquired MR images always contain both the device and its target.

Figure 7A:
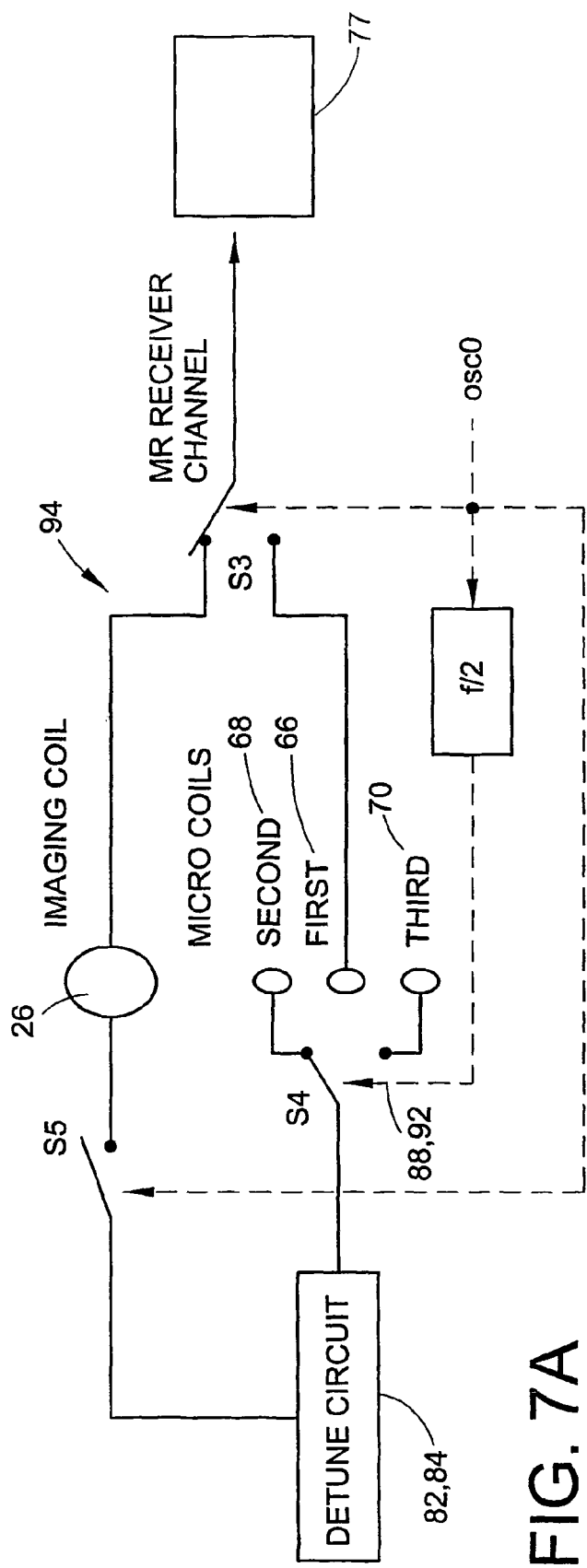
FIG. 7A is a block diagram illustrating the switching arrangements in accordance with the invention and 7B is timing diagram for the switching in accordance with the invention.
Figure 7B:
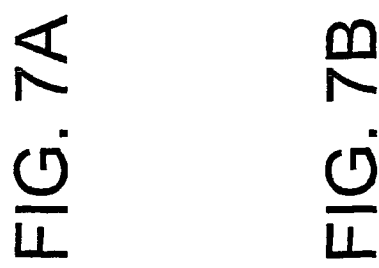

Referring to FIGS. 7A & 7B, a switching circuit for acquiring the information described above is shown generally at 94, for the single receiver channel Siemens systems used for this example. This device guidance system includes a total of four coils: one standard MR imaging coil 26 and the three micro RF coils 66, 68, 70. The switching circuit alternates between tracking the device trajectory and in which the coordinates of the second and third coils are determined, and MR imaging at a specific scan plane 50 determined as described above. Alternatively, systems having multiple receiver channels and/or phased array coil technology could be used. Each coil in these systems is directly connected to a respective receiver channel and the coil signals therefrom are processed individually by known software algorithms designed for such a scheme.

During the invasive device detection mode, the second 68 and third 70 coil signals are inductively coupled in an alternate manner to the first coil 66. The signal mutually induced on the first coil 66 is provided to the MR receive channel via leads 78.

Switch S3 alternatively toggles the connection of a single receiver channel in the MR system between the first micro coil 66, during the device detection mode, and the MR imaging coil during the MR image acquisition mode. A SPDT TQ9155 (TriQuint Semiconductor, Inc., Hillsboro, Oreg.) was found to provide a cost-effective RF switch for S3. It has an isolation of more than 60 dB at 100 MHz and even greater isolation at lower frequencies (e.g. 8.25 MHz here), although any suitable switch can be used. A third switch S5, was also implemented with an AQV221 to detune the MR imaging coil during the device coordinate determination.

The MR scanner controls the detuning and time domain multiplexing circuitry by providing a programmable synchronization bit, osc0, available through PARGEN (a pulse sequence development software available on the Siemens Mrsystem although similar software controlled signals are available on other scanners). This software parameter controlled the TTL output, SYN0, which was used to control the RF switching circuit, as shown in FIG. 6. Three optical isolators were used to avoid direct connections between the control signal and the three switching circuits. All electronic circuits except the detuning circuit for coils 1 and 2 were housed in a RF shielding box that was located 80 cm away from the catheter. Batteries were used for the power supplies in order to reduce electromagnetic noises and to avoid ground loops to ensure patient safety.

Figure 8B:
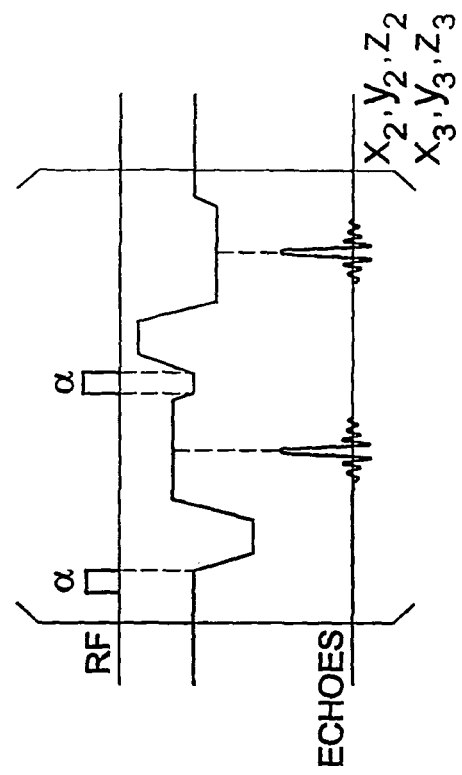
FIGS. 8A and 8B is a timing diagram illustrating the RF pulses, gradient signals and echo signals in accordance with the invention.
Figure 8A:
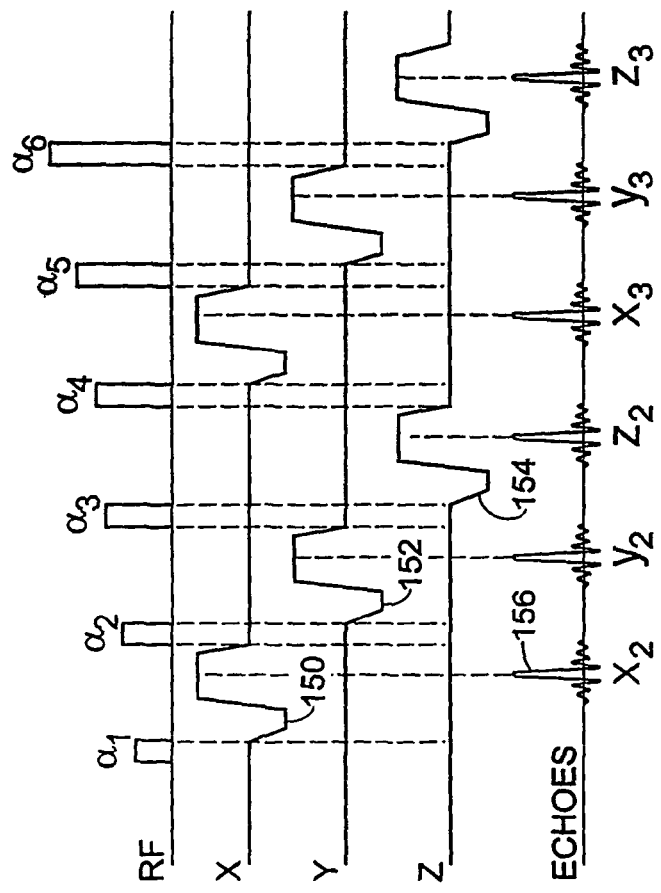

Referring now to FIGS. 8A and 8B, the device tracking sequence applies a series of RF and gradient pulses 150, 152, 154 along the X, Y and Z axes of the image respectively, induces voltages in the selected coils, and calculates 1DFTs 156 in a known manner to acquire the six coordinates ($X_1, Y_1, Z_1, X_2, Y_2, Z_2$) for two points within as short a duration as possible. An RF pulse sequence having six RF pulses $\alpha_1$-$\alpha_6$ of variable flip angles is implemented in a known manner. The third coil 70 is detuned by signal Osc0'0' and the second coil 68 is tuned as shown in FIG. 7b which causes switch S4 to connect the third coil to the detune circuit 82. Three RF pulses are used for acquiring three echoes for the coordinates $x_2, y_2$, and $z_2$.

As shown in FIG. 7B, the second coil 68 is detuned and the third coil 70 is tuned by signal Osc0'0' which causes switch S4 to connect the second coil to the detune circuit 82, 84. Three RF pulses are used for acquiring three echoes for the coordinates $x_3$, $y_3$, and $z_3$. Twelve RF pulses are used. Two gradient echoes using opposite-polarity gradients are acquired for detecting each coordinate to compensate the frequency shift caused by resonance offset conditions. A minimum of six pulses can be used (one for each axis, repeated twice, once for each coil 68, 70) if the gradient fields are sufficiently linear and the background static field are sufficiently homogeneous. Thus, the coordinates of the coils 68, 70 are acquired.

All MR imaging sequences are compatible for use with the device guidance system; typically True-FISP, FISP, FLASH or PSIF sequences, known to be useful for invasive MRI are employed.

Figure 9:
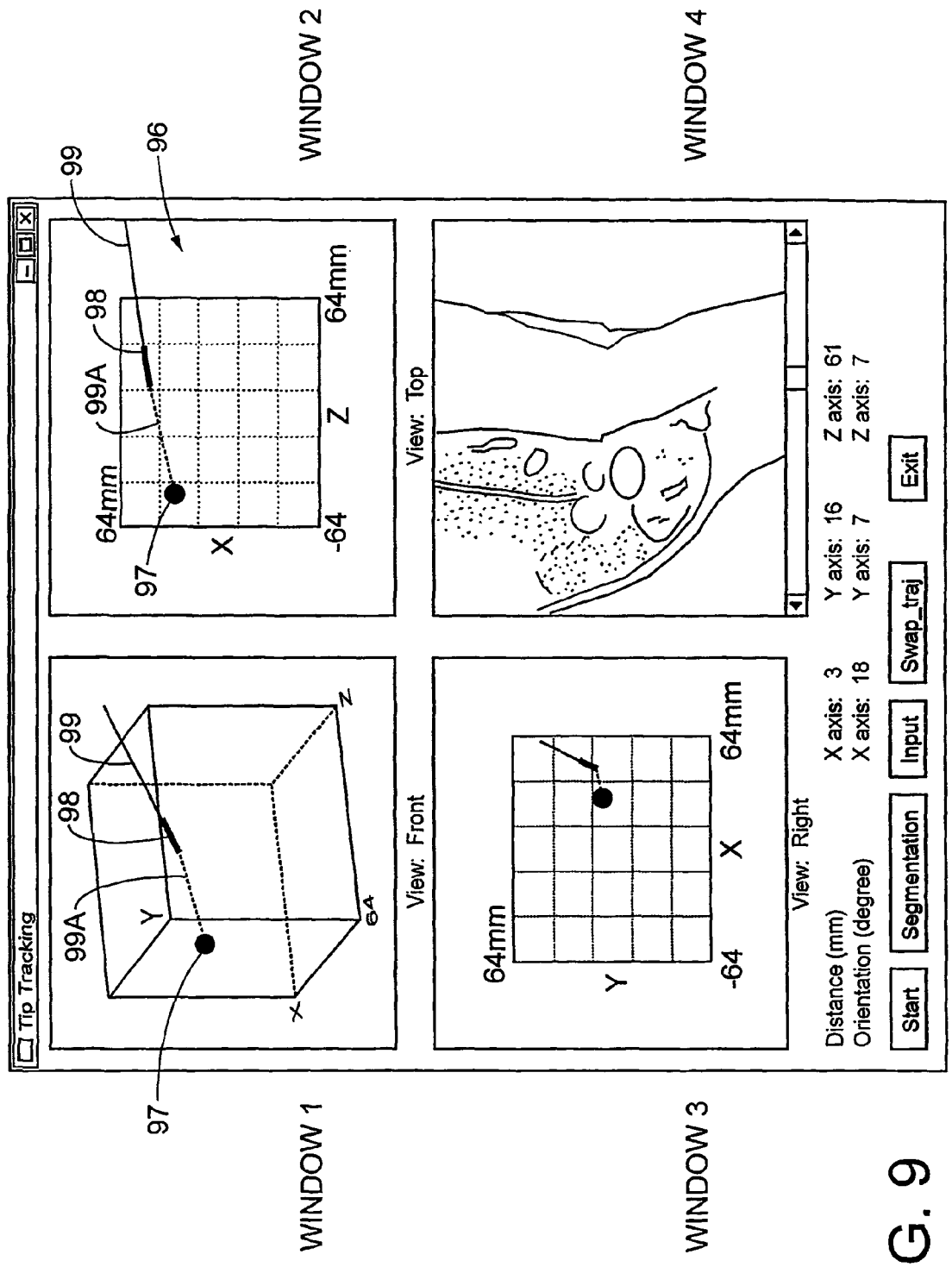
FIG. 9 is a diagram illustrating the graphic user interface in accordance with the invention.

A four window GUI 96 shown in FIG. 9 is used to provide the navigation and targeting information to the user on the screen 40. In the first three windows, a small 3D sphere 97 representing the segmented target tissue is displayed from three different perspectives. This 3D sphere shows only the position of the target tissue rather than its shape or volume. A short thick line 98 connects the two receive coils 68, 70 on the invasive device 60 to show the device orientation. A long thin line 99 was extends from the short line to represent the real trajectory of the invasive device. A second thin (dotted) lines 99A connects the target tissue and the invasive device tip to represent the ideal trajectory for the device penetration. Thus, the difference between the real and ideal invasive device trajectories is graphically represented. This angular difference and the distance between the device tip 64 and its target tissue were also tabulated and displayed on the bottom half of the GUI.

MR images acquired using the latest device position and orientation information and the segmented target tissue position are continuously updated in the fourth window during the intervention procedure. Because the scan plane is defined by the target tissue location and the position and orientation of the interventional device, they were always shown in updated MR images. The GUI was run directly on the MRI in-room computer console, thereby providing physicians on-line review of the current relative positions of the invasive device and its target.

Image segmentation is used to obtain the position of target tissues. The MR scan planes are defined by the positions of the two micro coils and the target tissue as described above and they are centered at the target tissue. Practically, there are three image segmentation methods available. Manual image segmentation can be applied to planning images once with the assumption that the acquired target tissue position is fixed during the interventional procedure. Secondly, manual image segmentation can be applied throughout the interventional procedure. The third method of image segmentation uses automatic image segmentation throughout the interventional procedure.

In all three methods, the initial position of a target tissue is identified by manual image segmentation before an interventional procedure is started. The first method is simplest and is easily applied to any interventional procedure. In the second method, information which is stored in the image header and graphical tools, including user selected mouse cursor locations, define the target tissues coordinates in the MR image as they are updated in window 4 of the GUI as shown below. The GUI calculates the spatial coordinates of the target tissue from the position of the mouse cursor and the orientation/position of the MR image.

Alternatively, an automatic image segmentation algorithm for the method can be run as a background process to find the target tissue positions during the intervention. The automatic algorithm is based on the known seeded region growing method with integrated spatial pixel value gradient information. The algorithm segments every image by starting from the image center that is the most recently identified location of the target tissue. While the second and third methods can quickly locate the target tissue with in-plane motion, these methods are less successful when the target moves out of the MR scan plane. However, because most subject motion is periodic (e.g., cardiac, respiratory), the target position typically oscillates away from its previous location and returns to its original position with the next image, whereupon the second and third methods would relocate the target tissue. If motion results in a loss of the target position after three consecutive updates, the device guidance system acquires three coronal images for segmentation. The coronal plane is selected for update since most subject motion occurs in this plane.

Segmentation methods (2) and (3) can quickly locate the target tissue with in-plane motion. When the target moves out of the MR scan plane, neither of the two semi-automated methods are able to find it. However, because most patient motion is periodic (e.g., cardiac, respiratory), the target tissue position was found to oscillate away from its previous location. Typically, the target tissue would return to its original position with the next image, whereupon methods (2) and (3) would relocate the target tissue. Image segmentation methods (2) and (3) can dynamically follow target tissues and thus avoid the roadmap concept. Practically, in these two methods, the automatic image segmentation is largely application-specific with the dependence on target tissue shape, image contrast, and image SNR, etc. The manual image segmentation is easier to implement and more consistent with different applications. Therefore, method (2) is a good option for acquiring the positions of target tissues.

Referring now to FIG. 10, a second embodiment of the invasive device 30, a catheter shown generally at 100. Although a catheter 100 is discussed for the purposes of illustrating the invention, it should be appreciated that the invasive device 30 can also be a guide wire, an endoscope, a laparoscope, a biopsy needle, or any other suitable known invasive device for use in an MR environment.

A 6.5F catheter was selected for use, although any suitably sized catheter may be used. The catheter 100 includes an inductive coupling structure 102, preferably disposed near the catheter tip 104 at a distance from about 1 to 10 mm, although for other catheters larger distances may be used. The inductive coupling structure 102 includes a first RF receive micro coil 106 for receiving MR signals as shall be descried below. The RF receive micro coil 106 includes a first winding element 108 (also referred to as $L_1$), a second winding element 110 (also referred to as $L_2$), and a third winding element 112 (also referred to as $L_3$) connected in series and disposed in a spaced-apart relationship along the end of the catheter 100. At least one of the winding elements are disposed from about 1 to 10 mm from the tip, although with other catheters greater distances may be used. The windings are fixed to the catheter using epoxy and a layer of transparent shrink-tube.

The first winding 108 is disposed between the second 110 and third 112 windings such that the distance between the first and second windings shown as d1 is different than the distance between the first and third windings shown as d2. However, it should be appreciated that more than three windings may be used in the first coil. The distance d1 between the first and second windings is 10 mm and the distance d2 between the first and third windings is 17 mm although any suitable distances may be used. The first 108, second 110 and third 112 windings include three turns of AWG30 wire, although any suitable number of turns of any suitable wire may be used to form the receiving coil. The second 110 and third 112 windings are wound in the opposite direction than the first winding 108 which is disposed between them, thereby forming two opposed solenoids. One or more tuning capacitors 114 are connected to the receive coil 106 to tune the coil to 8.25 MHz, the Larmor frequency of the 0.2 T MR scanner described above, in a known manner.

The inductive coupling structure 102 further includes a second RF micro coil 116, also referred to as the communicating coil, disposed adjacent the receive coil 106. The communicating coil 116 includes a winding 118 disposed adjacent one of the windings 108, 110, 112 of the receive coil 106 to inductively couple RF signals from the receive coil 106 to a single receiver channel 117 of a MR scanner, over conductive leads 118 and an impedance matching network 120 electrically connected to the leads 118.

Figure 11:
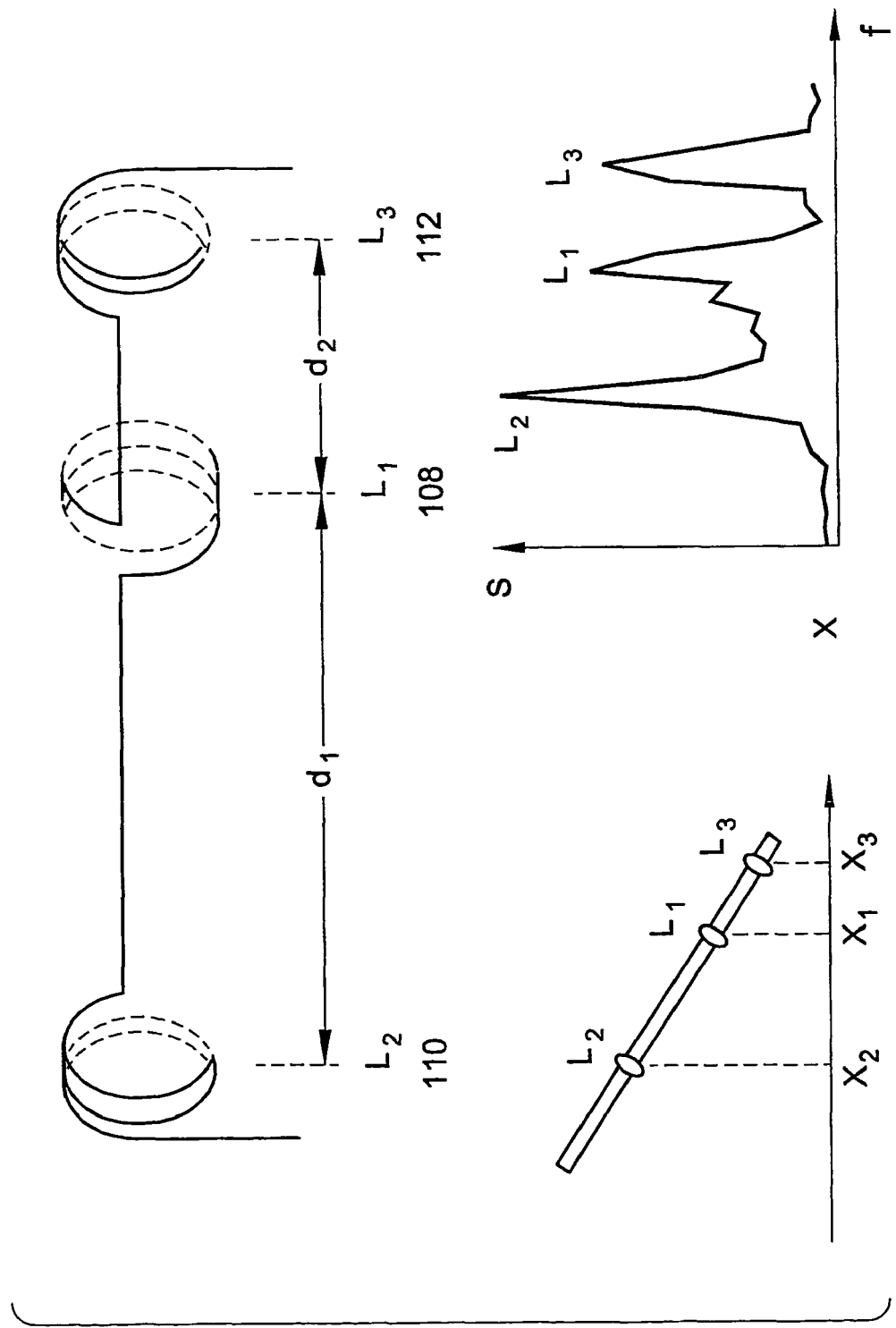
FIG. 11 is composite diagram illustrating the differently spaced winding elements of the device illustrated in FIG. 10B and the differently spaced peaks acquired in accordance with the invention.

The device orientation and tip position can be calculated from the a-priori knowledge of the positions of the winding elements when the coil is created and 1-DFT results along the axes of the imager. As shown in FIG. 11, a single micro coil with three unequally spaced winding elements provides three unequally spaced peaks in the 1 DFT of the acquired gradient echo as described above. If the gradient was applied along the X axis, the positions of these peaks correspond to the X coordinates of the multiple three winding elements of the single coil. With the assumption that the single coil was wound on a straight segment, the following inequalities are guaranteed: $x_3 > x_1 > x_2$ or $x_2 > x_1 > x_3$, where $x_1$, $x_2$, and $x_3$ were the X coordinates of the winding elements 108, 110, 112, respectively. Hence, the location of the middle peak always corresponds to $x_1$. As such, the correspondence of the other two winding elements 110, 112 and the other two peaks L2, L3 could be uniquely determined according to the distances d1 and d2 and the spacing between the spectral peaks.

Figure 12:
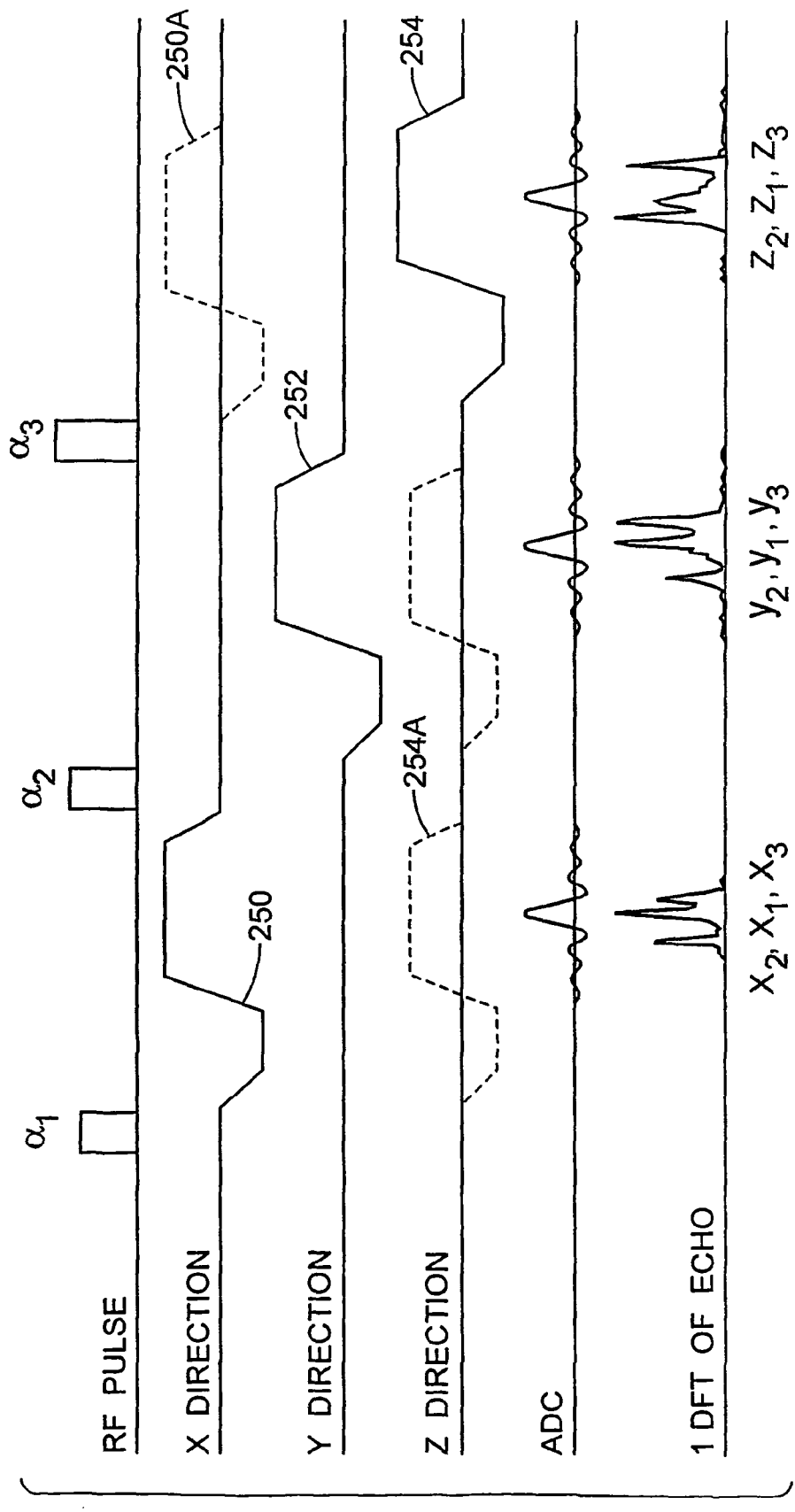
FIG. 12 is timing diagram illustrating the RF pulses, gradient signals and signals representing the coordinates of the device illustrated in FIG. 10B in accordance with the invention.

Referring to FIG. 12, in the 1DFT MR sequence three non-selective RF pulses $\alpha_1$ $\alpha_2$ $\alpha_3$ are applied sequentially. After each RF pulse, a field gradient 250 along one of three orthogonal directions was applied for frequency encoding. A line peak detection algorithm is implemented in order to locate the multiple detected peaks in the 1DFT of the gradient echo signals. This algorithm simply compares the amplitudes of the peaks and uses a priori coil design information such as the coil length and the different inter-coil distances d1 and d2 to determine the X, Y, and Z coordinates of each coil element 108, 110, 112.

The detected coordinates of the coil elements are then sent to a background C program which is implemented on the MR scanner computer, which automatically defines a MR scan plane calculated from the device orientation and tip position as described above. It also determines whether to initiate the program then toggle between MR image acquisition using the defined scan plane or to initiate the 1 DFT acquisitions needed to update the positions of the winding elements.

A graphical user interface was implemented on which the interventional device was graphically displayed in a 3D space; and its orientation and tip position were also tabulated in the GUI. The GUI was implemented with.

Figure 13B:
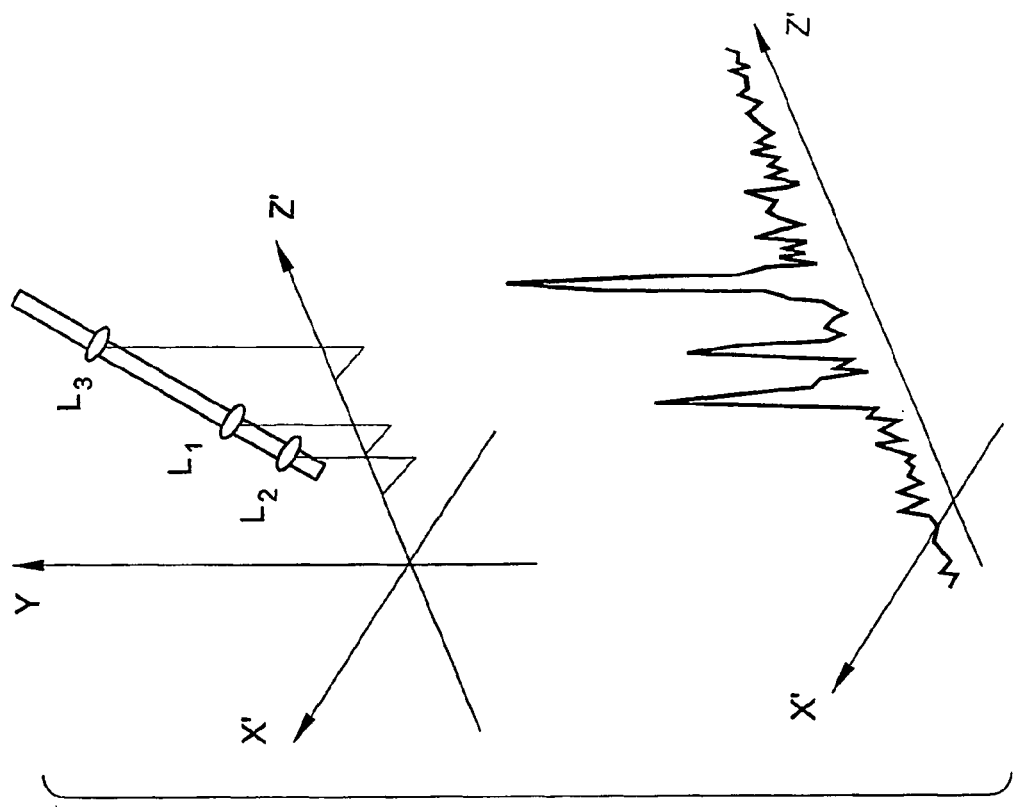
FIG. 13A is a composite diagram illustrating peak ambiguity and 13B is a composite diagram illustrating the rotation of the gradient axes as a solution in accordance with the invention.
Figure 13A:
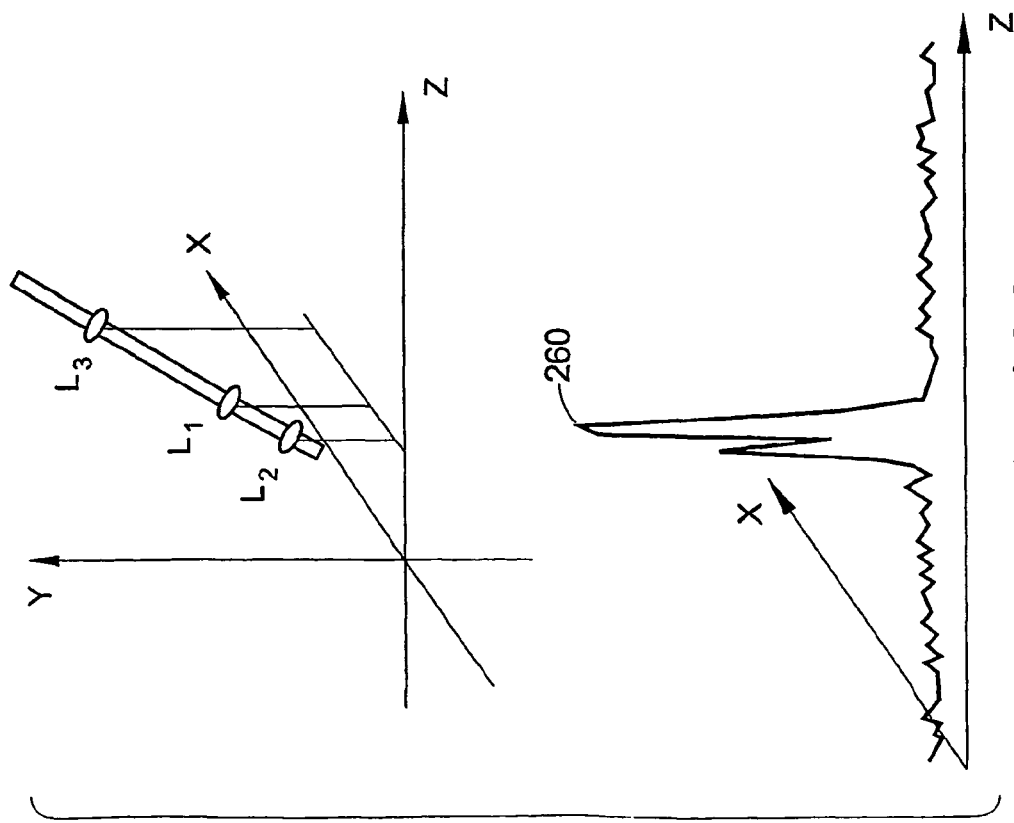

As described above, and with reference to FIG. 13A, peak ambiguity can lead to unnecessarily inaccurate determination of the peak locations 260 and hence erroneous or inaccurate determination of coil coordinates when the coil is near perpendicular to the gradient direction. However, if the MR coordinate system is rotated, as in FIG. 13B, three distinct peaks are detected along the Z' axis. With the X and Z' coordinates available, the physical Z coordinates of the first, second, and third winding elements are calculated as follows: $Z=(Z'-X \sin \alpha)/\cos \alpha$, where $0°<\alpha<90°$ and $\alpha$ is the counter-clockwise rotation angle. Practically, the MR coordinate system rotation could be realized by applying two orthogonal gradients simultaneously as indicated by the Z gradient shown in phantom in FIG. 12. The gradient amplitude used for rotating the Z axis is computed as $G_{z'}=G_z \cos \alpha + G_x \sin \alpha$, where $G_{z'}$, is the amplitude of the read gradient along Z' axis used in the 1DFT acquisition. Rotation of other axes is possible in an analogous manner.

Several versions of the 1DFT sequence with 45° gradient rotations around different axes can be made to solve the problems of peak ambiguity. An ASCII file can be created with multiple flag variables: Rotate_XZ_X (applying $G_x$ and $G_z$ simultaneously, as shown in FIG. 12, and processing the acquired signals to obtain coordinates along the X' axis), Rotate_XZ_Z (applying $G_x$ and $G_z$ simultaneously and processing the acquired signals to obtain coordinates along the Z' axis), and Rotate_YZ_Y (applying $G_y$ and $G_z$ simultaneously and processing the acquired signals to obtain coordinates along the Y' axis). Enabling a flag variable enabled MR measurement using appropriately rotated, corresponding to different versions of the 1 DFT sequences. The operator could interactively modify the control variables or file variables used to semaphore to change the status of any flag variable if peak ambiguity is thought to occur. This change can be detected by a C program running in the background; the program causes the MRI system to execute a pulse sequence that rotates the MR coordinate system for the ensuing MR measurements. The flag variables are initialized according to the initial orientation of the invasive device at the beginning of an interventional procedure. During the intervention, the operator can adjust the flag variables if the device is found to form an angle which is close to 90° to the field gradient on the GUI. While the embodiment described used C programming language, any suitable programming language is possible. Similarly, while the embodiment described uses the signal receiver channels and computers of the MR system, independent receivers and independent computers could be used and a suitable known communication link between the separate MR and tracking systems could be used to provide the determined coordinates to the MR system in a suitable manner.

The assumption that the three winding elements of the receiving coil 106 are located on a straight line is actually not valid with many invasive devices. Bending of a flexible invasive device inside a subject would cause the three elements of the incorporated micro coil to no longer be located on a straight line. If the projection of the long segment $L_1 L_2$ of the micro coil, representing d1 described above, along the gradient direction is shorter than that of the short segment $L_3 L_1$, representing d2 described above, the peak detection algorithm will then determine the peak locations incorrectly. However, as the segment $L_3 L_1$ was very short ($\leq 10$ mm), it is valid to assume that it would always be straight and that the bending would occur primarily at $L_1$. The coil design with three winding elements would allow limited device bending if the following inequality held:

$$d_1 \cos(\alpha+\beta) - d_1 \cos \alpha > \text{Sampling point resolution}$$

where $\alpha$ was the counter-clockwise rotation angle between the segment $L_3 L_1$ and the gradient, ($\alpha+\beta$) was the counter-clockwise rotation angle between the segment $L_1 L_2$ and the gradient (FIG. 14), Sampling point resolution was FOV/ sample numbers. Therefore, the maximum allowed bending angle $\beta_{max}$ could be calculated using the equation:

$$d_1 \cos(\alpha+\beta_{max})-d_2 \cos \alpha = \text{Sampling point resolution.} \quad (\text{Eq. 1})$$

Figure 14:
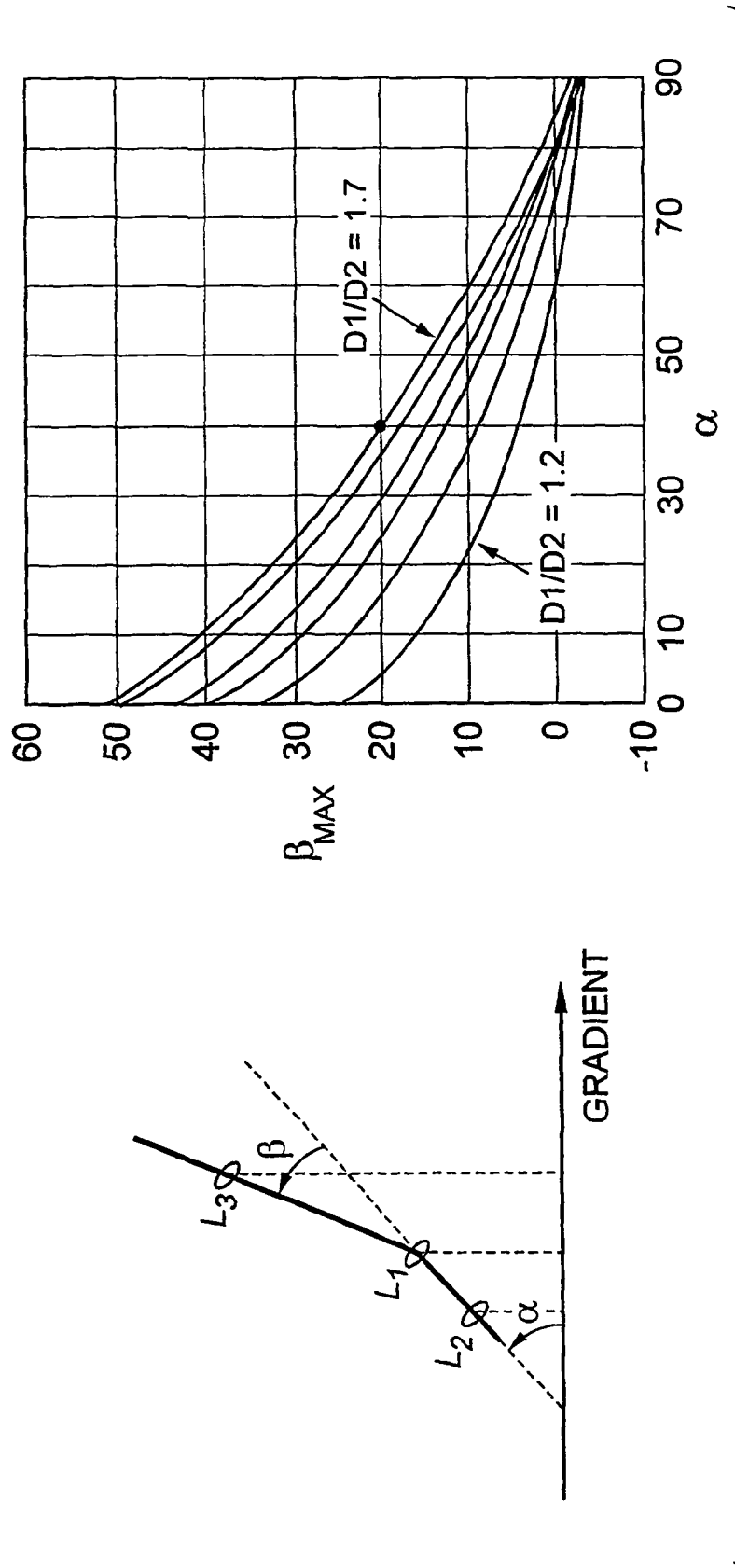
FIG. 14 is a composite diagram illustrating the effects of bending of the device shown in FIG. 10B.

As displayed in FIG. 14, $\beta_{max}$ decreased while the coil was more and more perpendicular to the gradient. When $\alpha$ was over a certain point, $\beta_{max}$ decreased to negative values which meant the counter-clockwise bending was not allowed any more. On the other hand, $\beta_{max}$ increased with the ratio of $d_1/d_2$. In this system, $d_1/d_2$ was 1.7. Therefore, the maximum bending allowed was 20° if the catheter formed a 40° angle to the gradient. The device tip position and orientation could be calculated using the coordinates of $L_3$ and $L_1$. The winding element $L_2$ was essential to determine the unique correspondence between the 1DFT peaks and the winding elements. Its coordinates may be helpful to determine the curvature of the invasive device. Eq. 1 may be combined with the peak detection algorithm in future to automatically decide when to rotate the MR coordinate system instead of manually adjusting the flag variables for rotation. With this constraint, accurate device localization may be expected even with obvious device bending.

The invention has been described with reference to the preferred embodiment. Obviously, modifications and alterations will occur to others upon reading and understanding the proceeding detailed description. It is intended that the invention be construed as including all such modifications and alterations insofar as they come within the scope of the appended claims or the equivalents thereof.

What is claimed is:

1. A catheter configured for use in a vasculature of a patient in an MR system, comprising:
   a first coil having a signal generating winding element for generating a first coil signal induced by the MR system, the first coil being arranged inside the catheter; and
   a second coil having a communicating winding element inductively coupled with the signal generating winding element for providing a coil signal representative of the first coil signal, the second coil being arranged inside the catheter;
   where the first coil includes a second signal generating winding element and a third signal generating winding element, where the first signal generating winding element and the second signal generating winding element are ie separated from the third signal generating winding element by a different distance,
   where the first coil and second coil are configured to provide an MR tracking signal.

2. The catheter of claim 1, where the first signal generating winding element and the second signal generating winding element form a first opposed solenoid and the first signal winding element and the third signal generating winding element form a second opposed solenoid.

3. The catheter of claim 1, comprising a flexible mounting structure on which the first coil and the second coil are secured, the winding elements being collinear with respect to each other when the flexible mounting structure is in a first position, and the winding elements not being collinear with respect to each other when the flexible mounting structure is in a second position.

4. The catheter of claim 1, where at least one of the winding elements is a loop.

5. The catheter of claim 1, where at least one of the winding elements is a saddle.

6. The catheter of claim 1, where the first and second coils are micro coils.

7. The catheter of claim 1, where the device includes a device tip, and where the first and second coils are located within about 5 mm of the tip.

8. The catheter of claim 1, comprising:
   a third coil including a signal generating winding element for generating a second coil signal induced by the MR system, the second coil having a second communicating winding element inductively coupled with the signal generating winding element of the third coil for providing a signal representative of the second coil signal.

9. The catheter of claim 8, where the communicating winding elements form an opposed solenoid.

10. A catheter configured for use in a vasculature of a patient in an MR system, comprising:
    a first coil including first, second, and third receiving winding elements for generating respective coil signals induced by the MR system, the first receiving winding element being disposed between the second receiving winding element and the third receiving winding elements and the second receiving winding element and the third receiving winding element being separated from the first receiving winding element by different distances; and
    a communicating coil disposed laterally adjacent and apart from the first coil, the communicating coil being inductively coupled to the first coil, where the communicating coil is configured to selectively couple respective coil signals from the first, second and third receiving winding elements to a common receive channel;
    where the first coil is configured to provide an MR tracking signal.

11. The catheter of claim 10, comprising a flexible mounting structure to which the winding elements are secured, the winding elements being collinear with respect to each other when the flexible mounting structure is in a first position, and the winding elements not being collinear with respect to each other when the flexible mounting structure is in a second position.

12. A catheter configured for use in a vasculature of a patient in an MR system, the catheter comprising:
    a first receive coil;
    a second receive coil;
    a communicating coil disposed between the first receive coil and the second receive coil, where the communicating coil is selectively inductively coupled to the first receive coil and the second receive coil such that the communicating coil is operative to selectively couple signals from the first receive coil and the second receive coil to a common receive channel,
    where the first receive coil and second receive coil are configured to provide an MR tracking signal.

13. The catheter of claim 12, where the first receive coil is laterally spaced apart from the second receive coil.

14. The catheter of claim 12, where the distance between the first receive coil and the communicating coil and where the distance between the second receive coil and the communicating coil is a function of the sampling point resolution of the MR system, the maximum allowed bending angle of the catheter segment between the first receive coil and the communicating coil, and the bending angle of a catheter segment between the second receive coil and the communicating coil, such that $d_1 \cos(\alpha+\beta_{max})-d_2 \cos \alpha = \text{Sampling Point Resolution}$, where $d_1$ is the distance between the first receive coil and the communicating coil, $d_2$ is the distance between the second receive coil and the communicating coil, $\alpha$ is and the bending angle of a catheter segment between the second receive coil and the communicating coil, $\beta_{max}$ is the maximum allowed bending angle of the catheter segment between the first receive coil and the communicating coil, and the Sampling Point Resolution is the sampling point resolution of the MR system.

15. A method, comprising:

obtaining a magnetic resonance (MR) image to register a location of a target within a subject;

tracking a trajectory vector of a flexible catheter in the subject, where the tracking is a function of data received by a coil located on the catheter;

dynamically defining a scan plane associated with the catheter as a function of the target location and the trajectory vector, where the trajectory vector is a function of an orientation of the catheter and a tip position of the catheter;

providing data identifying a slice position and an orientation, which defines the scan plane in terms of MR system coordinates and a planar rotation, to a processing unit; and acquiring an MR image at the scan plane, where the catheter comprises:

a first coil having a signal generating winding element for generating a first coil signal induced by the MR system; and a second coil having a communicating winding element inductively coupled with the signal generating winding element for providing a coil signal representative of the first coil signal;

where the first coil includes a second signal generating winding element and a third signal generating winding element, where the first signal generating winding element and the second signal generating winding element are separated from the third signal generating winding element by a different distance.

16. The method of claim 15, where dynamically defining a scan plane comprises:

toggling between an imaging mode, when data is received by an imaging coil, and a tracking mode, when data is received by a coil located on the catheter.

17. The method of claim 15, where tracking the trajectory vector of a flexible catheter comprises:

determining a location of the second signal generating winding element and a location of the third signal generating winding element based on the known distance between the first signal generating winding element and the second signal generating winding element and the first signal generating winding element and the third signal generating winding element.

18. The method of claim 17, where determining the location of a signal generating winding element comprises:

acquiring a gradient echo signal from an MRI apparatus;

computing a modified gradient echo signal from the gradient echo signal by subjecting the gradient echo signal to a one-dimensional Fourier transform (1DFT); and comparing amplitudes of peaks detected in the modified gradient echo signal to a priori coil design information about the first coil and the second coil, to determine the X, Y, and Z coordinates of the signal generating winding elements.

19. The method of claim 18, where the a priori coil design information about the first coil and the second coil comprises the distance between the first signal generating winding element and the third signal generating winding element, the distance between the first signal generating winding element and the second signal generating winding element, and the distance of the third signal generating winding element from the tip of the catheter.

20. The method of claim 15, where dynamically defining the scan plane as a function of the target location and the trajectory vector comprises:

determining a location of the scan plane as a function of the target location and a normal vector, the normal vector being determined by:

taking the cross product of the trajectory vector and a vector from the catheter tip position to the target location.

21. The method of claim 20, comprising determining the target location by performing one of:

manually segmenting the target location prior to guidance of the catheter when the target location position is fixed;

manually segmenting the target location throughout guidance of the catheter; and automatically segmenting the target location using seeded region growing with position correction.

22. The method of claim 21, where seeded region growing comprises:

performing region growing beginning at a point that is the most recently identified target location.

23. The method of claim 21, where position correction comprises:

correcting for loss of target location due to patient motion by acquiring three coronal MR images of the most recent target location for manual segmentation.

24. The method of claim 23, where the loss of target location occurs upon being unable to determine the target location after three consecutive updates of the MR image.

\* \* \* \* \*

UNITED STATES PATENT AND TRADEMARK OFFICE
CERTIFICATE OF CORRECTION

PATENT NO. : 7,835,780 B1
APPLICATION NO. : 10/240219
DATED : November 16, 2010
INVENTOR(S) : Duerk et al.

Page 1 of 1

It is certified that error appears in the above-identified patent and that said Letters Patent is hereby corrected as shown below:

Specification:

In column 2, line 62, delete "is" and insert --is a--.

In column 7, line 26, delete "line 99 was extends" and insert --line 99 extends--.

In column 9, line 61, delete "The GUI was implemented with".

In column 10, lines 24-25, delete "corresponding to different".

In column 11, line 46, claim 1, delete "ie".

In column 12, line 65, delete "is and the" and insert --is the--.

Signed and Sealed this
Fifteenth Day of February, 2011

David J. Kappos
*Director of the United States Patent and Trademark Office*